(12) United States Patent
Bucher et al.

(10) Patent No.: US 11,240,934 B1
(45) Date of Patent: Feb. 1, 2022

(54) THERMAL BRIDGE FOR AN ELECTRICAL COMPONENT

(71) Applicant: TE Connectivity Services GmbH, Schaffhausen (CH)

(72) Inventors: Alan Weir Bucher, Manheim, PA (US); Leo Joseph Graham, Hershey, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/935,493

(22) Filed: Jul. 22, 2020

(51) Int. Cl.
*H05K 7/20* (2006.01)
*F28F 3/06* (2006.01)
*H05K 1/02* (2006.01)
*G02B 6/42* (2006.01)

(52) U.S. Cl.
CPC ............ *H05K 7/2049* (2013.01); *F28F 3/06* (2013.01); *H05K 1/0203* (2013.01); *H05K 7/20472* (2013.01); *G02B 6/4269* (2013.01); *H05K 2201/06* (2013.01)

(58) Field of Classification Search
CPC ............... H05K 7/2049; H05K 1/0203; H05K 7/20472; H05K 2201/06; F28F 3/06
See application file for complete search history.

(56) References Cited

U.S. PATENT DOCUMENTS

| | | | | | |
|---|---|---|---|---|---|
| 4,448,240 A | * | 5/1984 | Sharon | ................ | H01L 23/4338 165/185 |
| 4,498,530 A | * | 2/1985 | Lipschutz | ........... | H01L 23/3672 165/185 |
| 4,535,841 A | * | 8/1985 | Kok | .................... | H01L 21/4882 156/155 |
| 4,765,400 A | * | 8/1988 | Chu | .................... | H01L 23/4338 165/185 |
| 4,800,956 A | * | 1/1989 | Hamburgen | ........ | H01L 23/4338 165/185 |
| 5,052,481 A | * | 10/1991 | Horvath | ............. | H01L 23/4006 165/185 |
| 5,083,373 A | * | 1/1992 | Hamburgen | .......... | H01L 23/433 257/714 |
| 5,097,385 A | * | 3/1992 | Chao-Fan Chu | ... | H01L 23/4336 165/104.33 |
| 6,199,627 B1 | * | 3/2001 | Wang | .................. | H01L 23/3672 165/185 |

(Continued)

FOREIGN PATENT DOCUMENTS

EP 0718883 A2 * 6/1996 ........... H01L 23/433

OTHER PUBLICATIONS

Corresponding U.S. Appl. No. 16/927,446, filed Jul. 13, 2020 (38 pages).

*Primary Examiner* — Robert J Hoffberg

(57) ABSTRACT

A thermal bridge includes upper and lower bridge assemblies including upper and lower plates arranged in stacks. Sides of the plates face each other to thermally interface the lower plates with the upper plates. The thermal bridge includes a spring element positioned between the upper bridge assembly and the lower bridge assembly. The thermal bridge includes an internal bridge frame having connecting elements that extend internally through the upper plates and the lower plates to hold the upper plates in the upper plate stack and to hold the lower plates in the lower plate stack.

23 Claims, 9 Drawing Sheets

(56) References Cited

U.S. PATENT DOCUMENTS

| | | | | |
|---|---|---|---|---|
| 6,883,592 B2* | 4/2005 | Lee | .................... | H01L 23/3677 |
| | | | | 165/185 |
| 6,910,271 B2* | 6/2005 | Peterson | ................ | F28F 23/00 |
| | | | | 165/185 |
| 7,131,199 B2* | 11/2006 | Peterson | ................ | F28F 23/00 |
| | | | | 29/890.03 |
| 7,277,291 B2* | 10/2007 | Ross | ................... | H01L 23/4338 |
| | | | | 165/104.33 |
| 9,343,851 B2* | 5/2016 | Bucher | .............. | H01R 13/6658 |
| 9,389,368 B1* | 7/2016 | Sharf | ................... | G02B 6/4269 |
| 9,509,102 B2* | 11/2016 | Sharf | ................... | G02B 6/4261 |
| 9,620,890 B1 | 4/2017 | Vino, IV et al. | | |
| 9,668,379 B1* | 5/2017 | Bucher | ................ | H01R 13/514 |
| 9,668,380 B2* | 5/2017 | Bucher | .............. | H05K 7/20445 |
| 9,841,772 B2 | 12/2017 | Bucher | | |
| 9,912,107 B2* | 3/2018 | Bucher | ................ | H01R 12/716 |
| 9,924,615 B2* | 3/2018 | Bucher | ................ | G02B 6/4292 |
| 10,178,804 B2* | 1/2019 | Sharf | .................... | H01R 12/70 |
| 10,965,067 B2* | 3/2021 | Bucher | .............. | H01R 12/716 |
| 10,993,352 B2 | 4/2021 | Bucher | | |
| 2006/0060328 A1* | 3/2006 | Ewes | .................. | H01L 23/427 |
| | | | | 165/80.2 |
| 2020/0373706 A1 | 11/2020 | Bucher et al. | | |
| 2021/0084791 A1* | 3/2021 | Bucher | .................. | B23P 15/26 |

* cited by examiner

THERMAL BRIDGE FOR AN ELECTRICAL COMPONENT

BACKGROUND OF THE INVENTION

The subject matter herein relates generally to heat dissipation for electrical components.

It may be desirable to transfer thermal energy (or heat) away from designated components of a system or device. Some systems use electrical components, such as electrical connectors, to transmit data and/or electrical power to and from different systems or devices. Some systems use electrical components, such as pluggable modules for transmitting data signals through communication cable(s) in the form of optical signals and/or electrical signals. Some systems use electrical components, such as integrated circuits, for controlling the system. The electrical components define heat generating sources within the system.

A common challenge that confronts developers of electrical systems is heat management. Thermal energy generated by electrical components within a system can degrade performance or even damage components of the system. To dissipate the thermal energy, systems include a thermal component, such as a heat sink, which engages the heat source, absorbs the thermal energy from the heat source, and transfers the thermal energy away. The heat sink is typically thermally coupled to another thermal component at yet another thermal interface. The components lose efficiency at each thermal interface. Additionally, it is difficult to achieve efficient thermal coupling at the interfaces due to limited thermal interface areas and variations in the surfaces, such as due to surface flatness of the interfacing surfaces.

Accordingly, there is a need for a thermal transfer assembly that efficiently transfers thermal energy away from an electrical component.

BRIEF DESCRIPTION OF THE INVENTION

In one embodiment, a thermal bridge is provided. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The outer ends of the lower plates are configured to face and thermally couple to an electrical component. The sides of the lower plates face the sides of the upper plates to thermally interface the lower plates with the upper plates. The thermal bridge includes a spring element positioned between the upper bridge assembly and the lower bridge assembly. The spring element includes an upper spring member engaging the upper plates to bias the upper plates in a first biasing direction generally away from the lower plates. The spring element includes a lower spring member engaging the lower plates to bias the lower plates in a second biasing direction generally away from the upper plates. The thermal bridge includes an internal bridge frame having connecting elements that extend internally through the upper plates and the lower plates to hold the upper plates in the upper plate stack and to hold the lower plates in the lower plate stack.

In another embodiment, a thermal bridge is provided. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. The upper plates include upper bridge plates and upper spacer plates. The upper bridge plates have upper overlapping region. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The lower plates include lower bridge plates and lower spacer plates. The lower bridge plates have lower overlapping regions. The lower plates are configured to face and thermally couple to an electrical component. The lower spacer plates are aligned with the upper bridge plates and the lower bridge plates are aligned with the upper spacer plates such that the lower overlapping regions overlap with the upper overlapping regions. The sides of the lower bridge plates thermally interface with the sides of the upper bridge plates. The thermal bridge includes a spring element positioned between the upper bridge assembly and the lower bridge assembly. The spring element includes an upper spring member engaging the upper plates to bias the upper plates in a first biasing direction generally away from the lower plates. The spring element includes a lower spring member engaging the lower plates to bias the lower plates in a second biasing direction generally away from the upper plates. The thermal bridge includes an internal bridge frame having connecting elements extending internally through the upper plates and lower plates to hold the upper plates in the upper plate stack and hold the lower plates in the lower plate stack.

In a further embodiment, a thermal bridge is provided. The thermal bridge includes an upper bridge assembly including a plurality of upper plates arranged in an upper plate stack. Each upper plate has a front end and a rear end. Each upper plate has sides between the front end and the rear end. Each upper plate has an inner end and an outer end. Each upper plate has a front thermal interface, a rear thermal interface and an upper thermal interface. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The sides of the lower plates face the sides of the upper plates to thermally interface the lower plates with the upper plates. Each lower plate has a front thermal interface, a rear thermal interface and a lower thermal interface. The thermal bridge includes a first cap plate coupled to a first side of the upper plate stack and the lower plate stack. The first cap plate has a first side thermal interface. The thermal bridge includes a second cap plate coupled to a second side of the upper plate stack and the lower plate stack. The second cap plate has a second side thermal interface. The thermal bridge includes a spring element positioned between the upper bridge assembly and the lower bridge assembly. The spring element includes an upper spring member engaging the upper plates to bias the upper plates in a first biasing direction generally away from the lower plates. The spring element includes a lower spring member engaging the lower plates to bias the lower plates in a second biasing direction generally away from the upper plates. The thermal bridge includes an internal bridge frame having connecting elements extending between the first cap plate and the second cap plate. The connecting elements hold the upper plates in the upper plate stack and the lower plates in the lower plate stack. The internal bridge frame extends internally through the lower plates such that the front thermal interface, the rear thermal interface and the lower thermal interface are unobstructed at the bottom of the lower bridge assembly for interfacing with an electrical component. The lower plates transfer heat from the electrical component to the upper plates. The internal bridge frame extends internally through the upper plates such that the front thermal interface, the rear thermal interface and the upper thermal interface are unobstructed at the top of the upper bridge assembly for interfacing with at least one heat transfer device. The upper plates transfer heat to the at least one heat transfer device.

DETAILED DESCRIPTION OF THE INVENTION

Figure 1:
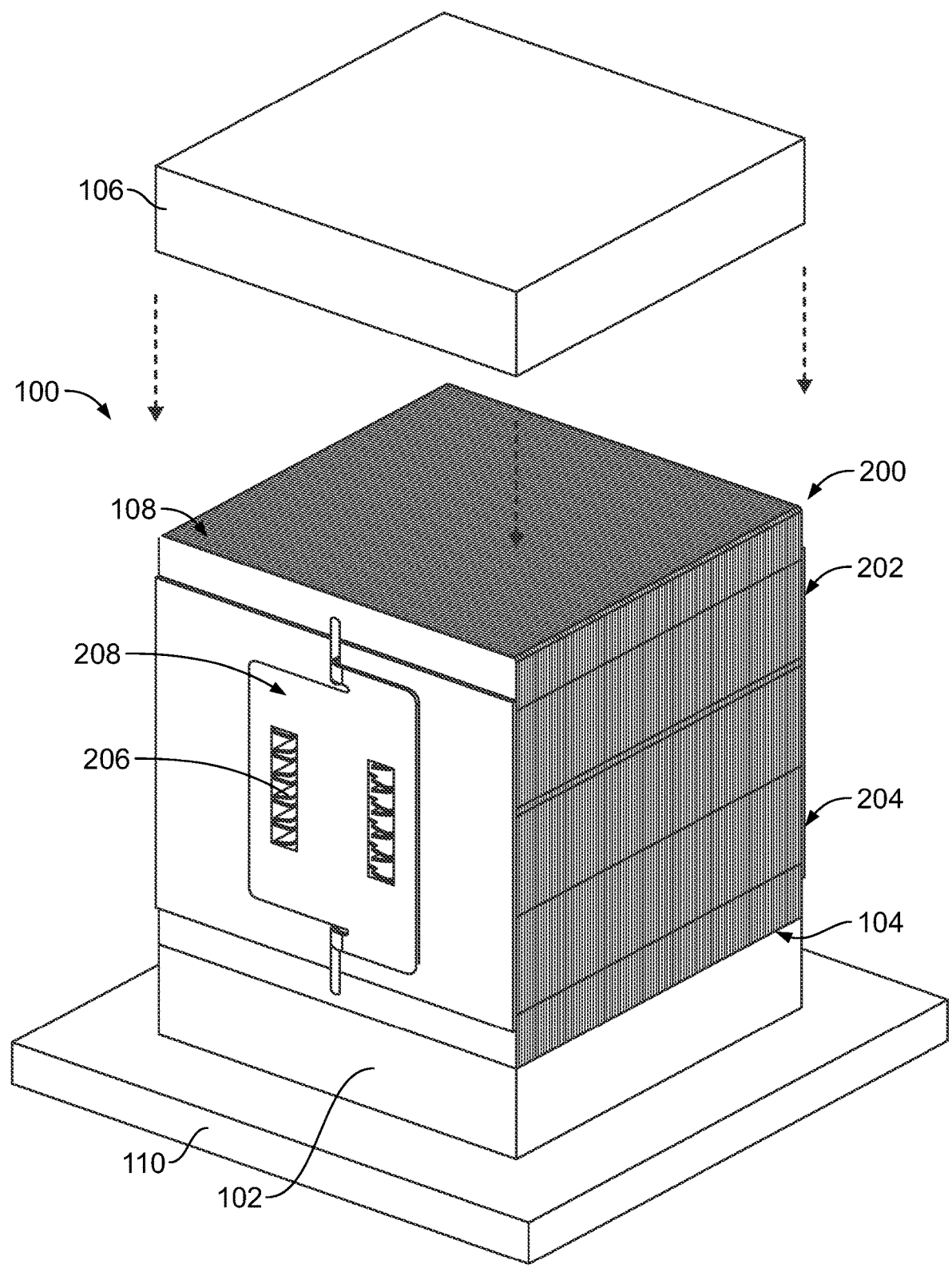
FIG. 1 is a front perspective view of a communication system and a thermal bridge in accordance with an exemplary embodiment for dissipating heat from at least one electrical component of the communication system.

FIG. 1 is a front perspective view of a communication system 100 and a thermal bridge 200 in accordance with an exemplary embodiment for dissipating heat from at least one electrical component 102 of the communication system 100.

The thermal bridge 200 is configured to be thermally coupled to the electrical component 102 at a lower thermal interface 104 at a bottom of the thermal bridge 200. In an exemplary embodiment, a heat transfer device 106 is provided to dissipate heat from the thermal bridge 200. For example, the thermal bridge 200 is configured to be thermally coupled to the heat transfer device 106 at an upper thermal interface 108. The thermal bridge 200 forms a thermal interface between the electrical component 102 and the heat transfer device 106. The heat transfer device 106 may be a heat sink, such as a finned heat sink, configured to be air cooled by transferring heat to the passing airflow. In other various embodiments, the heat transfer device 106 may be a heat spreader, a cold plate having liquid cooling, and the like.

In an exemplary embodiment, the thermal bridge is compressible between the electrical component 102 and the heat transfer device 106. In an exemplary embodiment, the lower thermal interface 104 is conformable to a shape of the electrical component 102 and the upper thermal interface 108 is conformable to a shape of the heat transfer device 106 for efficient thermal transfer therebetween.

In an exemplary embodiment, the electrical component 102 is mounted to a circuit board 110. In various embodiments, the electrical component 102 may be a communication connector, such as a receptacle connector, a header connector, a plug connector, or another type of communication connector. In other various embodiments, the electrical component 102 may be an electronic package, such as an integrated circuit. In other various embodiments, the electrical component 102 may be a pluggable module, such as an I/O transceiver module. Other types of electrical components may be provided in alternative embodiments.

In an exemplary embodiment, the thermal bridge 200 includes an upper bridge assembly 202, a lower bridge assembly 204, a spring element 206 between the upper and lower bridge assemblies 202, 204, and an internal bridge frame 208 for holding the upper and lower bridge assemblies 202, 204 together. The lower bridge assembly 204 is configured to thermally engage the electrical component 102. The upper bridge assembly 202 is configured to dissipate heat into the external environment and/or to the heat transfer device 106. The upper bridge assembly 202 is in thermal communication with the lower bridge assembly 204 and dissipates heat away from the lower bridge assembly 204 to cool the electrical component 102.

The spring element 206 biases the upper and lower bridge assemblies 202, 204 apart. The upper and lower bridge assemblies 202, 204 are compressible relative to each other. For example, the upper and lower bridge assemblies 202, 204 are compressible between the electrical component 102 and the heat transfer device 106.

In an exemplary embodiment, the internal bridge frame 208 provides internal support for the upper and lower bridge assemblies 202, 204. The internal support eliminates the need for an external frames, which provides more surface area for heat dissipation and/or for the thermal interface with the heat transfer device 106. In an exemplary embodiment, the spring element 206 presses the upper bridge assembly 202 outward in a first biasing direction (for example, upward) against the internal bridge frame 208 and the spring element 206 presses the lower bridge assembly 204 outward in a second biasing direction (for example, downward) against the internal bridge frame 208. The upper bridge assembly 202 and the lower bridge assembly 204 may be held by the internal bridge frame 208 in a manner to allow a limited amount of floating movement of the upper bridge assembly 202 and the lower bridge assembly 204 relative to the internal bridge frame 208.

Figure 2:
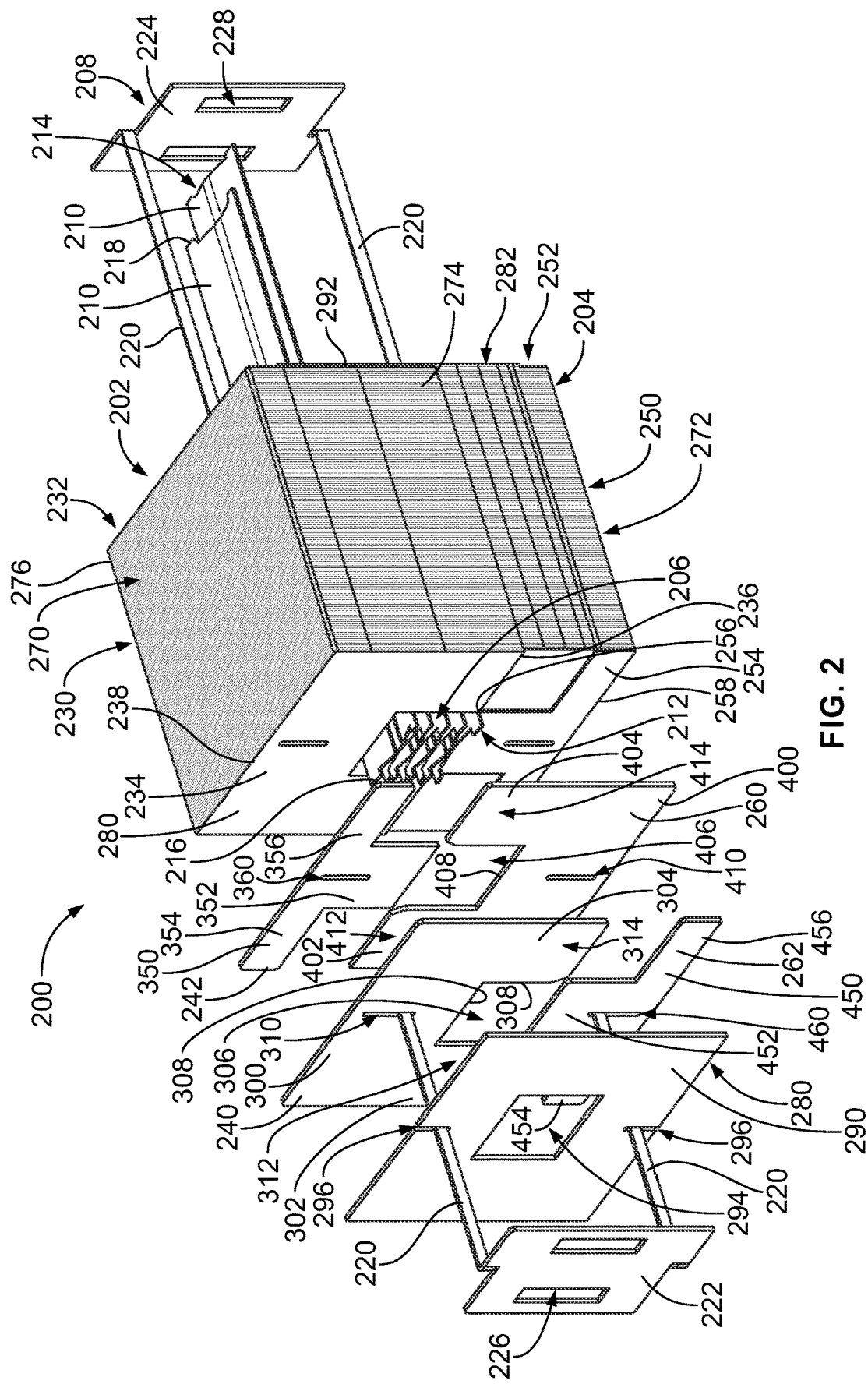
FIG. 2 is an exploded view of the thermal bridge in accordance with an exemplary embodiment.

FIG. 2 is an exploded view of the thermal bridge 200 in accordance with an exemplary embodiment. The thermal bridge 200 includes the upper bridge assembly 202 and the lower bridge assembly 204. The spring element 206 is located between the upper and lower bridge assemblies 202, 204. The internal bridge frame 208 is configured to hold the upper and lower bridge assemblies 202, 204.

In an exemplary embodiment, the thermal bridge 200 is parallelepiped (for example, generally box shaped). For example, the thermal bridge 200 includes a top 270, a bottom 272, a front 274, a rear 276, a first side 280, and a second side 282. The top 270 may be generally planar. The bottom 272 may be generally planar. The front 274 may be generally planar. The rear 276 may be generally planar. The first side 280 may be generally planar. The second side 282 may be generally planar. However, the thermal bridge 200 may have other shapes in alternative embodiments. The frame structure used to hold the thermal bridge 200 together is defined by the internal bridge frame 208 and is configured to be contained generally within the interior of the thermal bridge 200. As such, the outer surfaces of the thermal bridge 200 (for example, the top 270, bottom 272, front 274, rear 276, first side 280, and second side 282) are each exposed and accessible for heat dissipation and/or for interfacing with other components, such as the electrical component 102 and/or the heat transfer device 106 (both shown in FIG. 1). The internal bridge frame 208 allows for a large amount of usable external surface area for the thermal bridge 200. In an exemplary embodiment, the internal bridge frame 208 is only exposed at the first side 280 and the second side 282, preferably at a small footprint and remote from the top 270 and the bottom 272. In an exemplary embodiment, no portion of the internal bridge frame 208 extends along the front 274 or the rear 276. In an exemplary embodiment, no portion of the internal bridge frame 208 extends along the top 270 or the bottom 272.

In an exemplary embodiment, the internal bridge frame 208 is remote from the upper thermal interface 108 such that the internal bridge frame 208 does not obstruct the upper thermal interface 108 and provides a large amount of usable external surface area for interfacing with the heat transfer device 106. In an exemplary embodiment, the internal bridge frame 208 is remote from the lower thermal interface 104 such that the internal bridge frame 208 does not obstruct the lower thermal interface 104 and provides a large amount of usable external surface area for interfacing with the electrical component 102

In an exemplary embodiment, the bridge assemblies 202, 204 each include a plurality of plates that are arranged together in plate stacks. The plates are interleaved with each other for thermal communication between the upper bridge assembly 202 and the lower bridge assembly 204. The individual plates are movable relative to each other such that the plates may be individually articulated to conform to the electrical component 102 and/or the heat transfer device 106. For example, the individual plates may conform to the electrical component 102 at the lower thermal interface 104 for improved contact and/or proximity between the thermal bridge 200 and the electrical component 102 and/or the individual plates may conform to the heat transfer device 106 at the upper thermal interface 108 for improved contact and/or proximity between the thermal bridge 200 and the heat transfer device 106. A gap or space may be provided between the plates of the bridge assemblies 202, 204 to allow compressive movement of the spring element 206 between the bridge assemblies 202, 204.

In an exemplary embodiment, the upper bridge assembly 202 includes a plurality of upper plates 230 arranged in an upper plate stack 232. Each upper plate 230 has sides 234 extending between an inner end 236 and an outer end 238 of the upper plate 230. The inner end 236 faces the lower bridge assembly 204. The outer end 238 faces outward, such as toward the heat transfer device 106. Optionally, various upper plates 230 may have different shapes, such as different heights and/or different features between the inner end 236 and the outer end 238.

In an exemplary embodiment, the upper plates 230 include upper bridge plates 240 and upper spacer plates 242. The upper spacer plates 242 are located between the upper bridge plates 240. Each upper bridge plate 240 includes a base 300 at the outer end 238 and overlapping regions 312, 314 at the inner end 236 configured to overlap with adjacent lower plates of the lower bridge assembly 204. In the illustrated embodiment, the upper bridge plate 240 is upside-down U-shaped; however, the upper bridge plate 240 may have other shapes in alternative embodiments. In various embodiments, the upper bridge plate 240 includes a first leg 302 extending downward from the base 300 and a second leg 304 extending downward from the base 300 with an upper pocket 306 located between the first leg 302 and the second leg 304. The upper pocket 306 is open at the inner end, such as to receive a lower plate of the lower bridge assembly 204. The upper pocket 306 is defined by edges 308 extending along the base 300 and the legs 302, 304. The edges 308 at the top of the upper pocket 306 are configured to engage the spring element 206 when assembled. For example, the spring element 206 may be received in the upper pocket 306.

In an exemplary embodiment, the first leg 302 defines the overlapping regions 312 at the sides 234 of the upper bridge plate 240 and the second leg 304 defines the overlapping regions 314 at the sides 234 of the upper bridge plate 240. The overlapping regions 312, 314 are configured to overlap with adjacent lower plates of the lower bridge assembly 204. The overlapping regions 312, 314 provide large surface areas configured to be thermally coupled to the lower plates.

In an exemplary embodiment, the upper bridge plates 240 include slots 310 that receive the internal bridge frame 208. In an exemplary embodiment, the slots 310 are elongated, such as in a vertical direction to allow vertical movement of the upper bridge plates 240 relative to the internal bridge frame 208.

Each upper spacer plate 242 includes a spacer base 350 at the outer end 238 and a spacer tab 352 extending from the spacer base 350. The spacer tab 352 extends to the inner end 236 of the upper spacer plate 242. The spacer tab 352 may be approximately centered along the spacer base 350. The spacer base 350 includes a first arm 354 extending to a first side of the spacer tab 352 and a second arm 356 extending to a second side of the spacer tab 352. In the illustrated embodiment, the upper spacer plate 242 is T-shaped; however, the upper spacer plate 242 may have other shapes in alternative embodiments. In an exemplary embodiment, the spacer tab 352 is configured to be aligned with a corresponding lower plate of the lower bridge assembly 204, such as to be received in a pocket of such lower plate. A bottom edge of the spacer tab 352 may engage the spring element 206 when assembled.

In an exemplary embodiment, the upper spacer plates 242 include slots 360 that receive the internal bridge frame 208. In an exemplary embodiment, the slots 360 are elongated, such as in a vertical direction to allow vertical movement of the upper spacer plates 242 relative to the internal bridge frame 208.

In an exemplary embodiment, the lower bridge assembly 204 includes a plurality of lower plates 250 arranged in a lower plate stack 252. Each lower plate 250 has sides 254 extending between an inner end 256 and an outer end 258 of the lower plate 250. The inner end 256 faces the upper bridge assembly 202. The outer end 258 faces outward, such as toward the electrical component 102 (shown in FIG. 1). Optionally, various lower plates 250 may have different shapes and/or heights between the inner end 256 and the outer end 258.

In an exemplary embodiment, the lower plates 250 include lower bridge plates 260 and lower spacer plates 262. The lower spacer plates 262 are located between the lower bridge plates 260. Each lower bridge plate 260 includes a base 400 at the outer end 258 and overlapping regions 412, 414 at the inner end 256 configured to overlap with adjacent upper plates 230 of the upper bridge assembly 202. For example, the overlapping regions 412, 414 overlap with the overlapping regions 312, 314 of the upper bridge plates 240. In the illustrated embodiment, the lower bridge plate 260 is U-shaped; however, the lower bridge plate 260 may have other shapes in alternative embodiments. In various embodiments, the lower bridge plate 260 includes a first leg 402 extending upward from the base 400 and a second leg 404 extending upward from the base 400 with a lower pocket 406 located between the first leg 402 and the second leg 404. The lower pocket 406 is open at the inner end 256, such as to receive the spacer tab 352 of the corresponding upper spacer plate 242. The lower pocket 406 is defined by edges 408 extending along the base 400 and the legs 402, 404. The edges 408 may guide the spacer tab 352 into the lower pocket 406. Optionally, the edges 408 may be chamfered to guide the spacer tab 352 into the lower pocket 406. The edges 408 at the bottom of the lower pocket 406 is configured to engage the spring element 206 when assembled. For example, the spring element 206 may be received in the lower pocket 406.

In an exemplary embodiment, the first leg 402 defines the overlapping regions 412 at the sides 254 of the lower bridge plate 260 and the second leg 404 defines the overlapping regions 414 at the sides 254 of the lower bridge plate 260. The overlapping regions 412, 414 are configured to overlap with the overlapping regions 312, 314 of the adjacent upper bridge plates 240. The overlapping regions 412, 414 provide large surface areas configured to be thermally coupled to the upper bridge plates 240. The overlapping regions 412, 414 are configured to overlap the overlapping regions 312, 314 by an overlap distance sufficient to allow efficient thermal transfer between the lower plates 250 and the upper plates 230. The sides of the plates are slidable relative to each other to allow movement between the upper plates 230 and the lower plates 250 and change the overlap distance.

In an exemplary embodiment, the lower bridge plates 260 include slots 410 that receive the internal bridge frame 208. In an exemplary embodiment, the slots 410 are elongated, such as in a vertical direction to allow vertical movement of the lower bridge plates 260 relative to the internal bridge frame 208.

Each lower spacer plate 262 includes a spacer base 450 at the outer end 258 and a spacer tab 452 extending from the spacer base 450. The spacer tab 452 extends to the inner end 256 of the lower spacer plate 262. The spacer tab 452 may be approximately centered along the spacer base 450. The spacer base 450 includes a first arm 454 extending to a first side of the spacer tab 452 and a second arm 456 extending to a second side of the spacer tab 452. In the illustrated embodiment, the lower spacer plate 262 is upside-down T-shaped; however, the lower spacer plate 262 may have other shapes in alternative embodiments. In an exemplary embodiment, the spacer tab 452 is configured to be aligned with the upper pocket 306 of the corresponding upper bridge plate 240, such as to be received in the upper pocket 306. The spacer tab 452 may be guided into the upper pocket 306 by the edges 308. The edges 308 may be chamfered to guide the spacer tab 452 into the upper pocket 306. A top edge of the spacer tab 452 may engage the spring element 206 when assembled.

In an exemplary embodiment, the lower spacer plates 262 include slots 460 that receive the internal bridge frame 208. In an exemplary embodiment, the slots 460 are elongated, such as in a vertical direction to allow vertical movement of the lower spacer plates 262 relative to the internal bridge frame 208.

In an exemplary embodiment, the spring element 206 is separate and discrete from the upper and lower bridge assemblies 202, 204. The spring element 206 may be a stamped and formed part. The spring element 206 is manufactured from a thin metal material such that the spring element 206 is flexible. In an exemplary embodiment, the spring element 206 includes a plurality of spring plates 210 that are arranged in a spring plate stack located between the upper and lower bridge assemblies 202, 204. In the illustrated embodiment, the spring plates 210 are vertically stacked to provide spring forces in the vertical direction. Other types of spring elements 206 may be used in alternative embodiments, such as coil springs, leaf springs, C-shaped channel springs, and the like. Optionally, the spring elements 206 may be segmented to include a plurality of spring tabs separated by gaps that are movable independent from each other to provide independent spring pressure.

The spring element 206 is configured to be received in the upper and lower pockets 306, 406. The spring element 206 is located between the upper plates 230 and the lower plates 250. For example, the spring element 206 is located between the spacer tab 352 and the edge 408 at the bottom of the lower pocket 406 and the spring element 206 is located between the spacer tab 452 and the edges 308 at the top of the upper pocket 306. The spring plates 210 are compressible between the upper plates 230 and the lower plates 250. In the illustrated embodiment, the spring plates 210 are cupped leaf springs arranged back-to-back to form the spring element 206. The spring plates 210 are arranged in an alternating upward facing and downward facing pattern. The spring plates 210 meet either at the outer edges or at the center in the stack of spring plates. Any number of spring plates 210 may be provided depending on the amount of spring force required, the spacing between the upper plates 230 and the lower plates 250, and the size of the spring plates 210. Other types of spring elements may be provided in alternative embodiments.

The spring element 206 extends between a first side 212 and a second side 214. The spring element 206 includes tabs 216, 218 at the first and second sides 212, 214, respectively. The tabs 216, 218 may be used for locating the spring element 206 relative to the internal bridge frame 208. The tabs 216, 218 may engage the internal bridge frame 208 to position the spring element 206 internally within the thermal bridge 200. The tabs 216, 218 may be located at the outer tips of the spring element 206. The tabs 216, 218 may alternatively (or additionally) be approximately centered between the edges rather than the outer tips.

In an exemplary embodiment, the internal bridge frame 208 includes connecting elements 220 that extend internally through the upper bridge assembly 202 and the lower bridge assembly 204. The connecting elements 220 are configured to capture the upper plates 230 in the upper plate stack 232 and the lower plates 250 and the lower plate stack 252. The connecting elements 220 may be coupled to the opposite side plate 222 or 224. For example, the connecting element may be latched or welded to the opposite side plate 222, 224. In an exemplary embodiment, the connecting elements 220 include one or more upper connecting element and one or more lower connecting element. The upper connecting element 220 is received in the upper slots 310, 360 of the upper bridge plates 240 and the upper spacer plates 242, respectively. The lower connecting element 220 is received in the lower slots 410, 460 of the lower bridge plates 260 and the lower spacer plates 262.

In an exemplary embodiment, the internal bridge frame 208 includes a first side plate 222 at a first side of the upper bridge assembly 202 and a first side of the lower bridge assembly 204 and a second side plate 224 at a second side of the upper bridge assembly 202 and a second side of the lower bridge assembly 204. The connecting elements 220 extend between the first side plate 222 and the second side plate 224. In various embodiments, the connecting elements 220 may be formed integral with the first side plate 222 and/or the second side plate 224. For example, the side plates 222, 224 and the connecting elements 220 may be stamped and formed from a sheet of metal. In alternative embodiments, the connecting elements 220 may be separate from the side plates 222, 224 and secured thereto, such as by soldering, crimping, latching, clipping, using fasteners or otherwise securing the connecting elements 220 to the side plates 222, 224. In other alternative embodiments, the connecting elements 220 may be secured to the thermal bridge 200 without the use of the side plates 222, 224. For example, the connecting elements 220 may be secured directly to plates of the upper bridge assembly 202 and/or the lower bridge assembly 204.

In an exemplary embodiment, the connecting elements 220 are flat, planar spars configured to pass through the upper and lower plates 230, 250. For example, the connecting elements 220 may be stamped and formed from a metal sheet. The connecting elements 220 may be generally rectangular in cross-section. However, other types of connecting elements may be used in alternative embodiments. For example, the connecting elements 220 may be round or square pins that may be manufactured by an extrusion process. Other types of connecting elements 220 may be used in alternative embodiments.

In an exemplary embodiment, the first and second side plates 222, 224 include slots 226, 228, respectively. The slots 226, 228 receive the tabs 216, 218 of the spring element 206. For example, the tabs 216, 218 may protrude from the plate stacks into the slots 226, 228. The slots 226, 228 may be located near the sides. Alternatively, the slots 226, 228 may additionally, or alternatively, be located at the center of the corresponding plates 222, 224. Optionally, the slots 226, 228 may be oversized relative to the tabs 216, 218 to allow a limited amount of floating movement of the tabs 216, 218 within the slots 226, 228. For example, the slots 226, 228 may accommodate compression and expansion of the spring element 206. The slots 226, 228 may accommodate vertical movement within the slots 226, 228 and may accommodate horizontal movement within the slots 226, 228. Providing oversized slots 226, 228 resists binding of the spring element 206 when the spring element 206 is expanded or contracted.

In an exemplary embodiment, the thermal bridge 200 includes a first cap plate 290 and a second cap plate 292. The first cap plate 290 is provided at the first side 280 and the second cap plate 292 is provided at the second side 282. The upper plate stack 232 and the lower plate stack 252 are held between the cap plates 290, 292. In an exemplary embodiment, the cap plates 290, 292 each include an opening 294 that receives the spring element 206. The openings 294 are aligned with the upper and lower pockets 306, 406. In an exemplary embodiment, the cap plates 290, 292 each include slots 296 that receive the connecting elements 220. The slots 296 are aligned with the slots 310, 410. The first and second side plates 222, 224 are configured to be coupled to the first and second cap plates 290, 292. In alternative embodiments, the thermal bridge 200 may be provided without the side plates 222, 224 and/or without the cap plates 290, 292. For example, the connecting elements 220 may be coupled directly to the cap plates 290, 292 rather than the side plates 222, 224. In alternative embodiments, the thermal bridge 200 may be provided without the cap plates 290, 292, rather using the side plates 222, 224 to hold the plate stacks.

Figure 3:
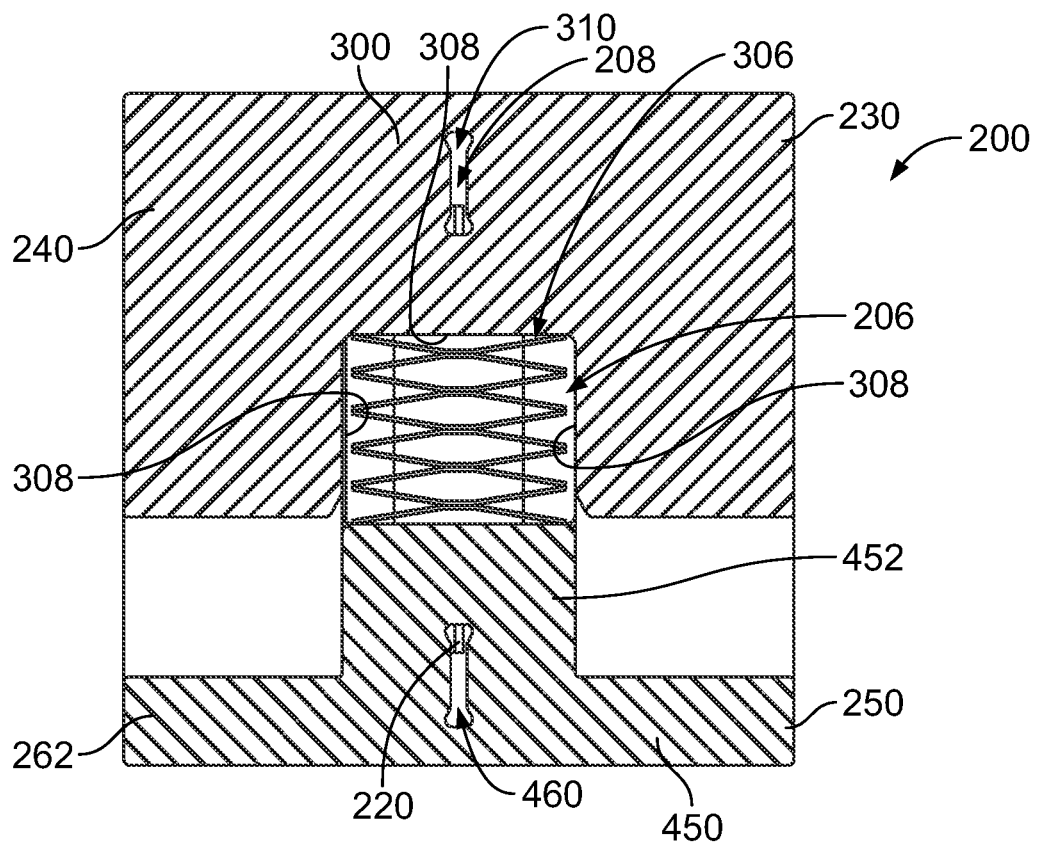
FIG. 3 is a cross-sectional view of the thermal bridge taken through one of the upper bridge plates and one of the lower spacer plates in accordance with an exemplary embodiment showing the thermal bridge in an expanded state.
Figure 4:
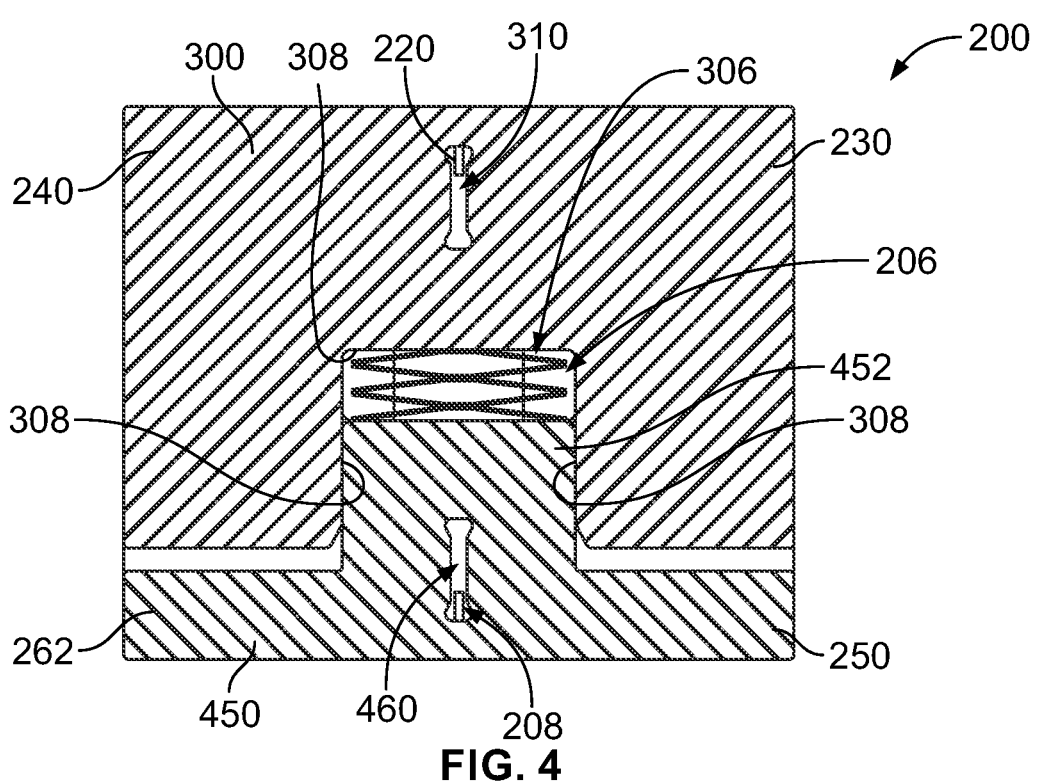
FIG. 4 is a cross-sectional view of the thermal bridge taken through one of the upper bridge plate and the lower spacer plates in accordance with an exemplary embodiment showing the thermal bridge in a compressed state.

FIG. 3 is a cross-sectional view of the thermal bridge 200 taken through one of the upper bridge plates 240 and one of the lower spacer plates 262 in accordance with an exemplary embodiment showing the thermal bridge 200 in an expanded state. FIG. 4 is a cross-sectional view of the thermal bridge 200 taken through one of the upper bridge plate 240 and the lower spacer plates 262 in accordance with an exemplary embodiment showing the thermal bridge 200 in a compressed state.

When assembled, the lower spacer plate 262 is aligned with the upper bridge plate 240. The spacer tab 452 is aligned with the upper pocket 306. The spacer tab 452 is movable within the upper pocket 306 as the thermal bridge 200 is compressed and expanded. The edges 308 of the upper pocket 306 guide the spacer tab 452 in the upper pocket 306.

The spring element 206 is received in the upper pocket 306 between the upper plate 230 and the lower plate 250. The spring element 206 presses the upper plate 230 in an upward biasing direction and presses the lower plate 250 in a downward biasing direction. The spring element 206 tends to separate the upper plate 230 from the lower plate 250 to press the base 300 of the upper bridge plate 240 into thermal engagement with the heat transfer device 106 and to press the spacer base 450 of the lower spacer plates 262 into thermal engagement with the electrical component 102. The upper bridge plate 240 and the lower spacer plate 262 are independently movable relative to each other and relative to adjacent upper plates 230 and lower plates 250. The upper plates 230 are configured to float relative to the lower plates 250 and the spring elements 206 allow the floating movement of the upper plates 230 and the lower plates 250. As such, the upper mating interface is conformable to the heat transfer device 106 and the lower mating interface is conformable to the electrical component 102.

The internal bridge frame 208 passes through the upper bridge plate 240 and the lower spacer plate 262. For example, the connecting elements 220 pass through the slot 310 and the slot 460. In the expanded state, the connecting elements 220 are located at or near the inner edges of the slots 310, 460. In the compressed state, the connecting elements 220 are located at or near the outer edges of the slots 310, 460.

Figure 5:
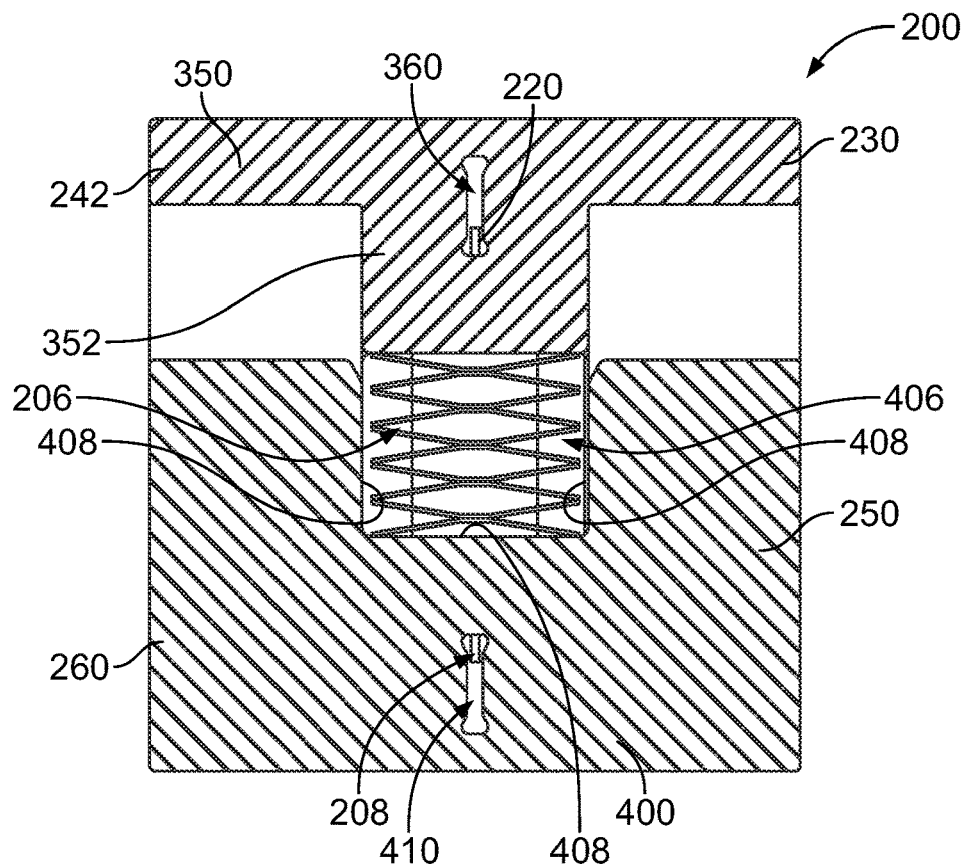
FIG. 5 is a cross-sectional view of the thermal bridge taken through one of the upper spacer plates and one of the lower bridge plates in accordance with an exemplary embodiment showing the thermal bridge in an expanded state.
Figure 6:
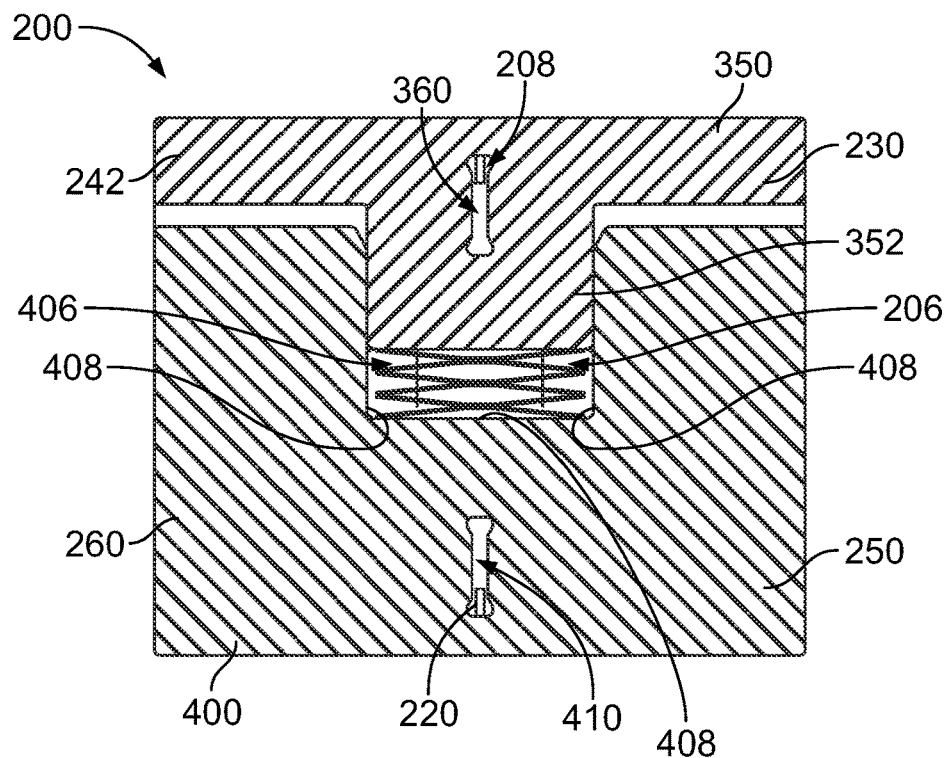
FIG. 6 is a cross-sectional view of the thermal bridge taken through the upper spacer plate and the lower bridge plate in accordance with an exemplary embodiment showing the thermal bridge in a compressed state.

FIG. 5 is a cross-sectional view of the thermal bridge 200 taken through one of the upper spacer plates 242 and one of the lower bridge plates 260 in accordance with an exemplary embodiment showing the thermal bridge 200 in an expanded state. FIG. 6 is a cross-sectional view of the thermal bridge 200 taken through the upper spacer plate 242 and the lower bridge plate 260 in accordance with an exemplary embodiment showing the thermal bridge 200 in a compressed state.

When assembled, the upper spacer plate 242 is aligned with the lower bridge plate 260. The spacer tab 352 is aligned with the lower pocket 406. The spacer tab 352 is movable within the lower pocket 406 as the thermal bridge 200 is compressed and expanded. The edges 408 of the lower pocket 406 guide the spacer tab 352 in the lower pocket 406.

The spring element 206 is received in the lower pocket 406 between the upper plate 230 and the lower plate 250. The spring element 206 presses the upper plate 230 in an upward biasing direction and presses the lower plate 250 in a downward biasing direction. The spring element 206 tends to separate the upper plate 230 from the lower plate 250 to press the spacer base 350 of the upper spacer plate 242 into thermal engagement with the heat transfer device 106 and to press the base 400 of the lower bridge plate 260 into thermal engagement with the electrical component 102. The upper spacer plate 242 and the lower bridge plate 260 are independently movable relative to each other and relative to adjacent upper plates 230 and lower plates 250.

The internal bridge frame 208 passes through the upper spacer plate 242 and the lower bridge plate 260. For example, the connecting elements 220 pass through the slot 360 and the slot 410. In the expanded state, the connecting elements 220 are located at or near the inner edges of the slots 360, 410. In the compressed state, the connecting elements 220 are located at or near the outer edges of the slots 360, 410.

Figure 7:
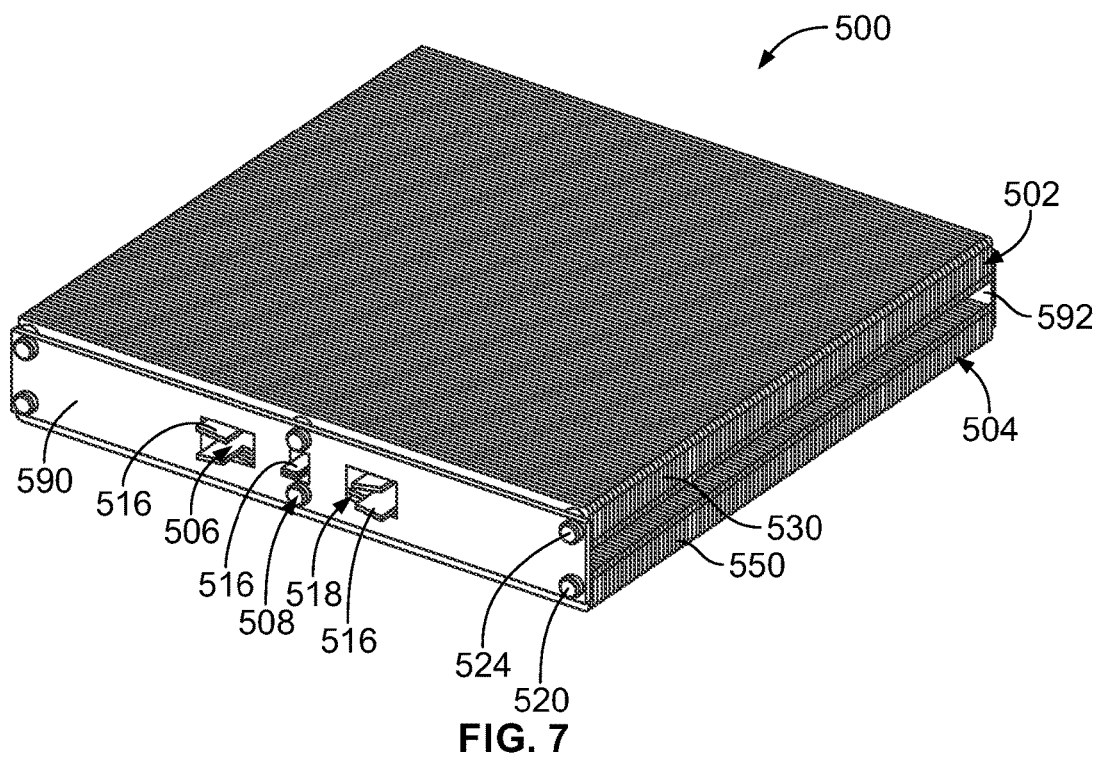
FIG. 7 is a perspective view of a thermal bridge in accordance with an exemplary embodiment.
Figure 8:
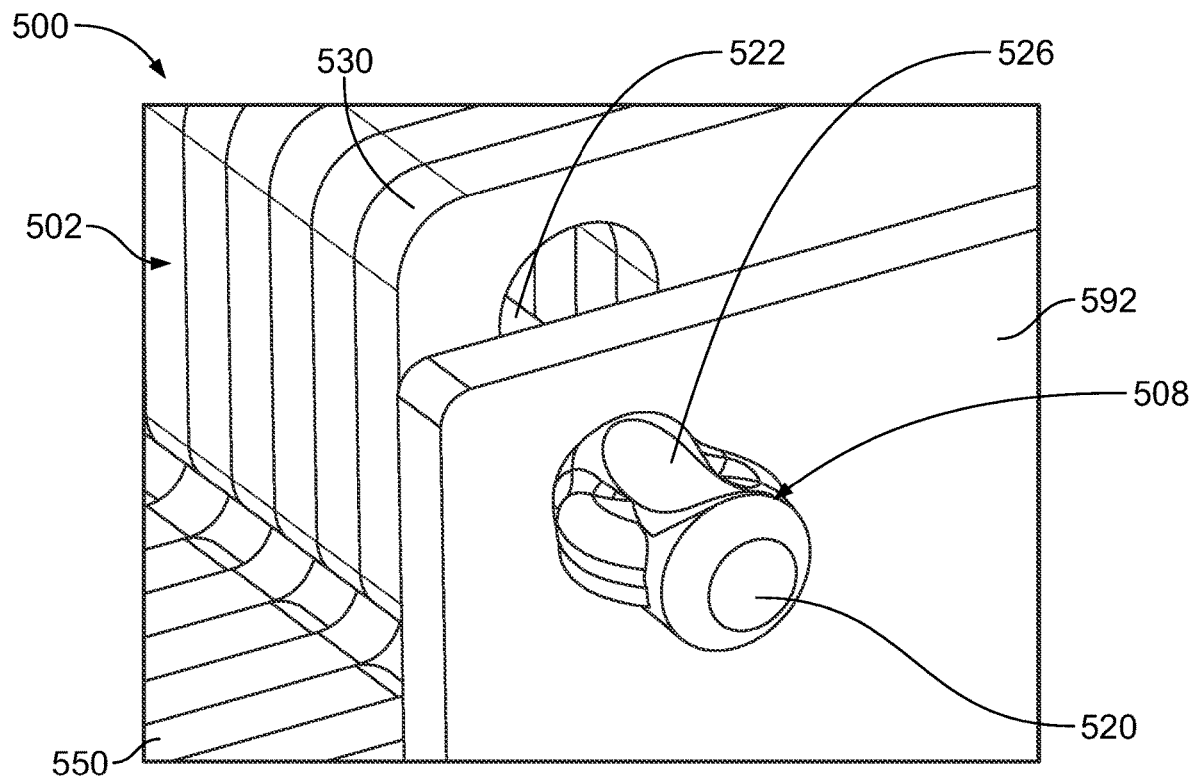
FIG. 8 is an enlarged view of a portion of the thermal bridge in accordance with an exemplary embodiment.

FIG. 7 is a perspective view of a thermal bridge 500 in accordance with an exemplary embodiment. FIG. 8 is an enlarged view of a portion of the thermal bridge 500 in accordance with an exemplary embodiment. The thermal bridge 500 is sized and shaped differently than the thermal bridge illustrated in FIGS. 1 and 2. The thermal bridge 500 includes similar features as the thermal bridge 200. The thermal bridge 500 is shaped differently than the thermal bridge 200 being short and long as opposed to generally cube shaped. Other shapes are possible in alternative embodiments for the thermal bridge 500 or the thermal bridge 200.

The thermal bridge 500 includes an upper bridge assembly 502 including a plurality of upper plates 530 and a lower bridge assembly 504 including a plurality of lower plates 550. A spring element 506 is provided between the upper bridge assembly 502 and the lower bridge assembly 504. The thermal bridge 500 includes an internal bridge frame 508 extending through the interior of the thermal bridge 500 to hold the upper and lower plate stacks together. The thermal bridge 500 includes cap plates 590, 592 at first and second sides of the thermal bridge 500 to hold the upper and lower plate stacks together. The internal bridge frame 508 is coupled to the cap plates 590, 592.

In an exemplary embodiment, the internal bridge frame 508 includes connecting elements 520 passing through slots in the upper plates 530 and the lower plates 550. Optionally, each upper plate 530 may include a plurality of slots receiving corresponding connecting elements 520 and each lower plate 550 may include a plurality of slots receiving corresponding connecting elements 520. In various embodiments, the connecting elements 520 may have various shapes and may be connected to the cap plates by various methods. For example, the connecting elements 520 may include pins 522 extending between a head 524 (FIG. 7) and a tip 526 (FIG. 8). The tip 526 may be deformed, such as by pressing, coining or riveting the end of the pin 522. In the illustrated embodiment, three sets of connecting elements 520 are provided, such as at a front, a rear and a middle of the thermal bridge 500.

In an exemplary embodiment, the spring element 506 is approximately centered between the front and the rear of the thermal bridge 500. The tabs 516 extend from ends of the spring element 506. The tabs 516 are received in openings 518 in the cap plates 590, 592. The tabs 516 may be used to locate the spring element 506 relative to the upper and lower plates 530, 550. The tabs 516, 518 may be located at the outer tips of the spring element 506. The tabs 516, 518 may alternatively (or additionally) be approximately centered between the edges rather than the outer tips. Optionally, the spring elements 506 may be segmented to include a plurality of spring tabs separated by gaps that are movable independent from each other to provide independent spring pressure.

Figure 9:
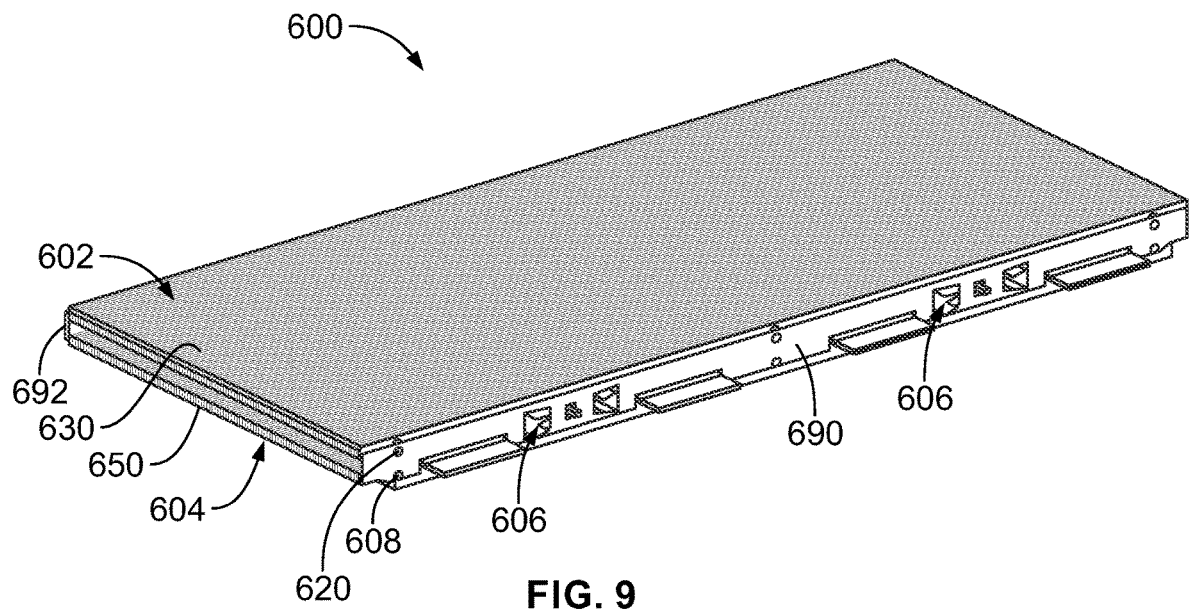
FIG. 9 is a perspective view of a thermal bridge in accordance with an exemplary embodiment.
Figure 10:
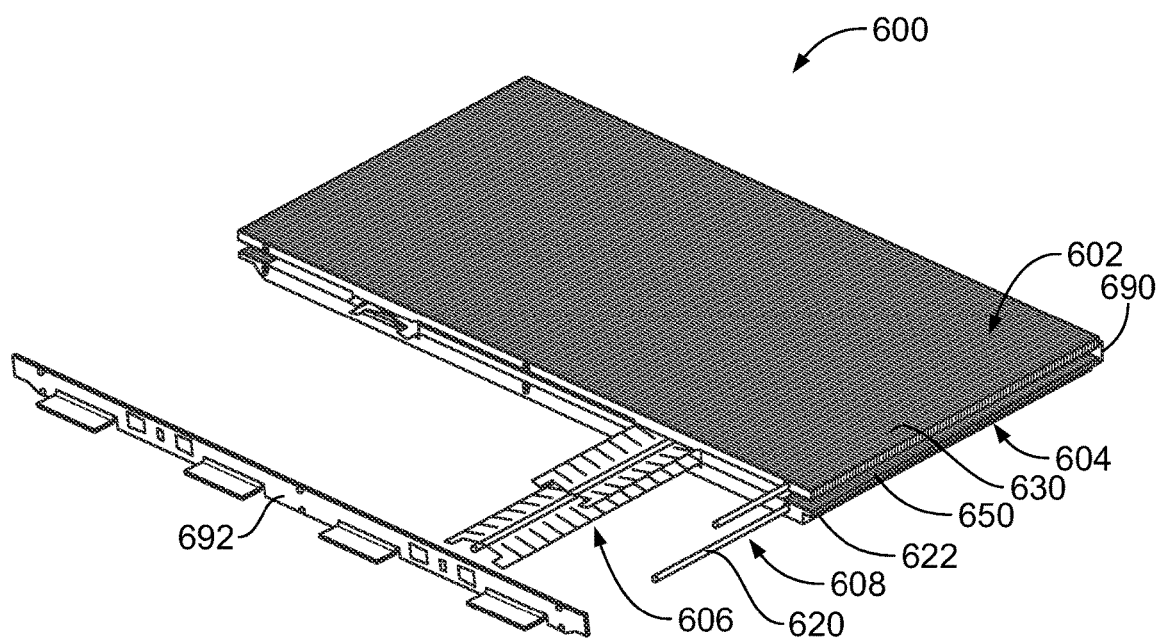
FIG. 10 is an exploded view of the thermal bridge in accordance with an exemplary embodiment.
Figure 11:
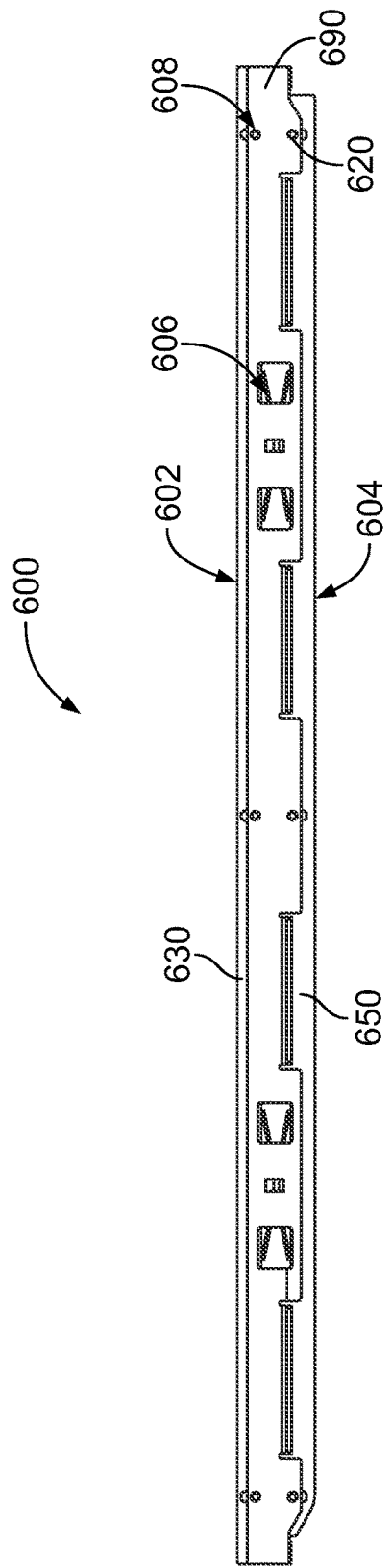
FIG. 11 is a side view of the thermal bridge in accordance with an exemplary embodiment.
Figure 12:
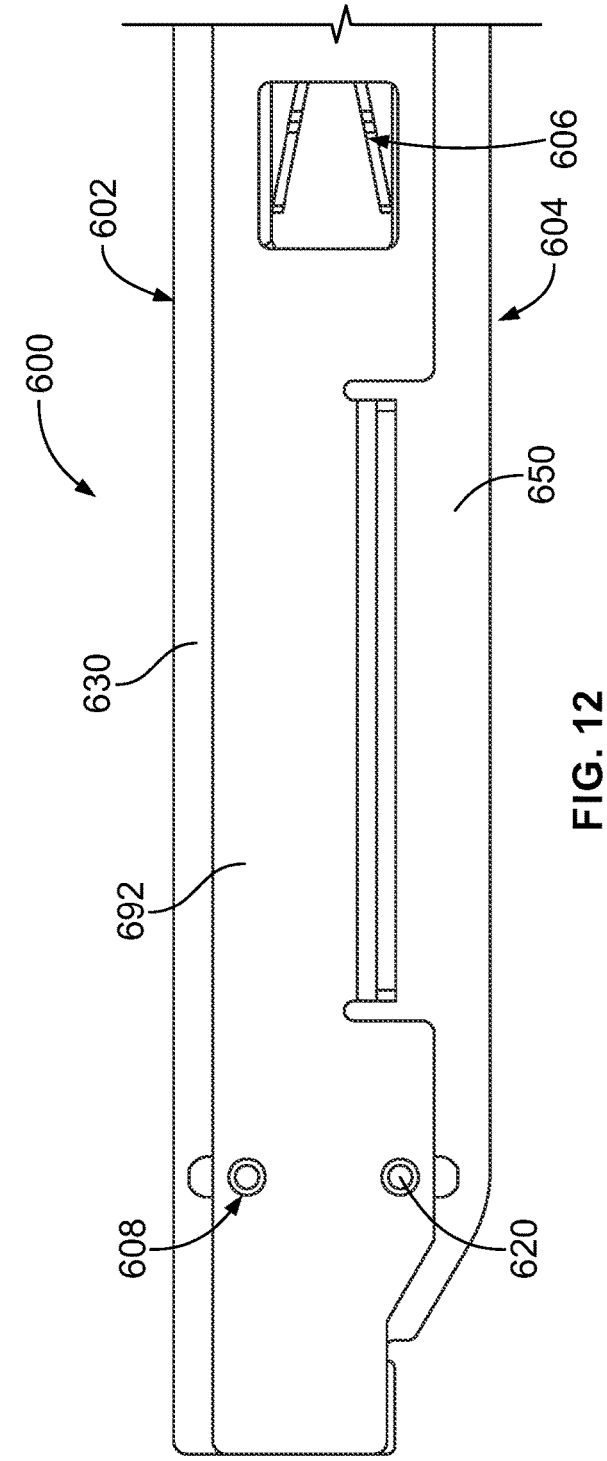
FIG. 12 is an enlarged side view of the thermal bridge in accordance with an exemplary embodiment.

FIG. 9 is a perspective view of a thermal bridge 600 in accordance with an exemplary embodiment. FIG. 10 is an exploded view of the thermal bridge 600 in accordance with an exemplary embodiment. FIG. 11 is a side view of the thermal bridge 600 in accordance with an exemplary embodiment. FIG. 12 is an enlarged side view of the thermal bridge 600 in accordance with an exemplary embodiment.

The thermal bridge 600 is sized and shaped differently than the thermal bridge 200 illustrated in FIGS. 1 and 2 and the thermal bridge 500 illustrated in FIG. 7. The thermal bridge 600 includes similar features as the thermal bridges 200, 500.

The thermal bridge 600 includes an upper bridge assembly 602 including a plurality of upper plates 630 and a lower bridge assembly 604 including a plurality of lower plates 650. One or more spring elements 606 are provided between the upper bridge assembly 602 and the lower bridge assembly 604. The thermal bridge 600 includes an internal bridge frame 608 extending through the interior of the thermal bridge 600 to hold the upper and lower plate stacks together. The thermal bridge 600 includes cap plates 690, 692 at first and second sides of the thermal bridge 600 to hold the upper and lower plate stacks together. The internal bridge frame 608 is coupled to the cap plates 690, 692.

In an exemplary embodiment, the internal bridge frame 608 includes connecting elements 620 passing through slots in the upper plates 630 and the lower plates 650. Optionally, each upper plate 630 may include a plurality of slots receiving corresponding connecting elements 620 and each lower plate 650 may include a plurality of slots receiving corresponding connecting elements 620. In various embodiments, the connecting elements 620 include pins 622. In the illustrated embodiment, three sets of connecting elements 620 are provided, such as at a front, a rear and a middle of the thermal bridge 600.

In an exemplary embodiment, the thermal bridge 600 includes a plurality of the spring elements 606. For example, in the illustrated embodiment, the thermal bridge 600 includes a front spring element 606 near a front of the thermal bridge 600 and a rear spring element 606 near a rear of the thermal bridge 600. The spring elements 606 may be identical to each other.

Figure 13:
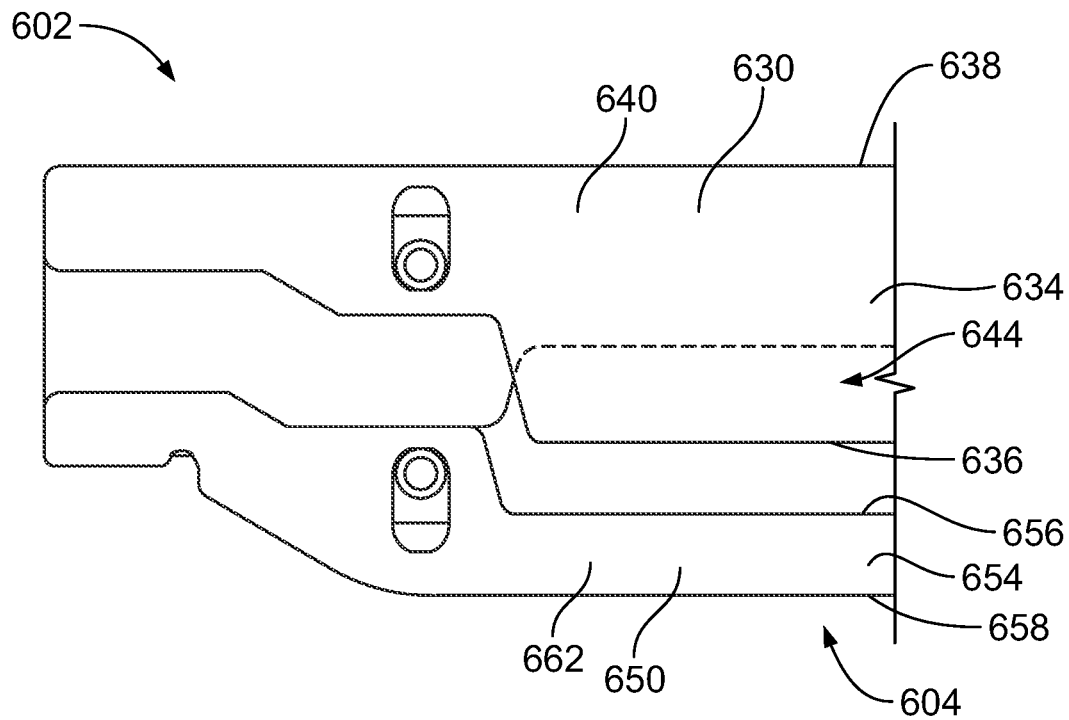
FIG. 13 is a side view of a portion of the thermal bridge in accordance with an exemplary embodiment.
Figure 14:
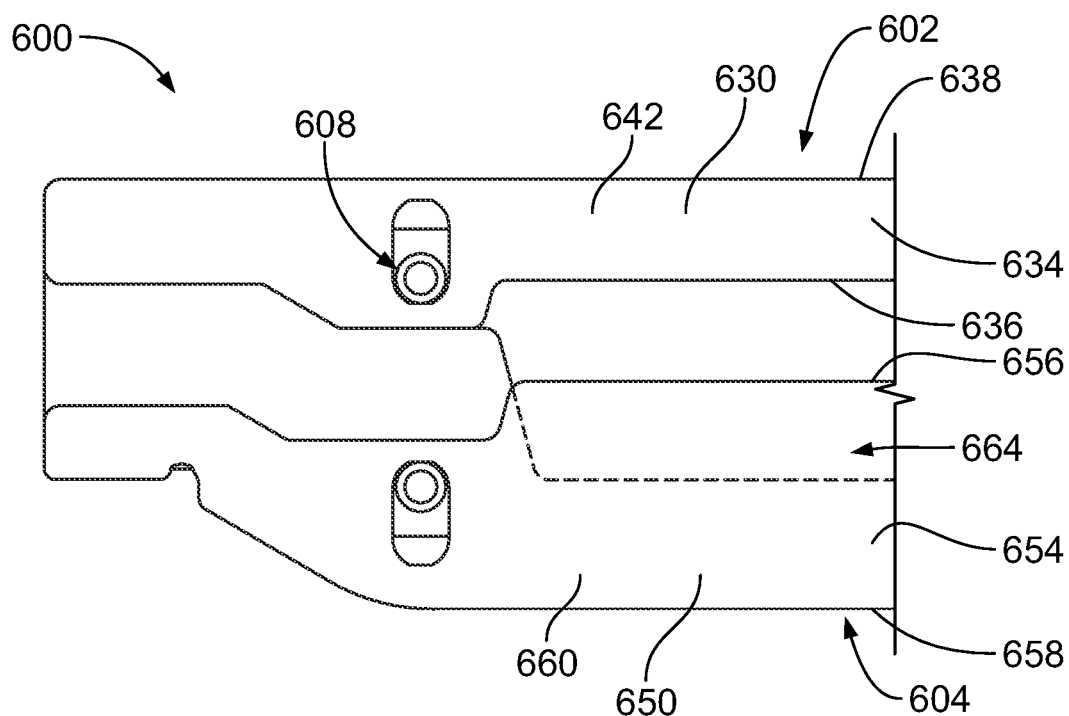
FIG. 14 is a side view of a portion of the thermal bridge in accordance with an exemplary embodiment.

FIG. 13 is a side view of a portion of the thermal bridge 600 in accordance with an exemplary embodiment. FIG. 14 is a side view of a portion of the thermal bridge 600 in accordance with an exemplary embodiment.

Each upper plate 630 has sides 634 extending between an inner end 636 and an outer end 638 of the upper plate 630. The inner end 636 faces the lower bridge assembly 604. The outer end 638 faces outward, such as to interface with the heat transfer device 106 (shown in FIG. 1). In an exemplary embodiment, the upper plates 630 include upper bridge plates 640 (FIG. 13) and upper spacer plates 642 (FIG. 14). The upper spacer plates 642 are located between the upper bridge plates 640. The upper spacer plates 642 are shorter than the upper bridge plates 640. The upper bridge plate 640 include overlapping regions 644 configured to overlap with adjacent lower plates 650 for thermal transfer between the lower plates 650 and the upper plates 630.

Each lower plate 650 has sides 654 extending between an inner end 656 and an outer end 658 of the lower plate 650. The inner end 656 faces the upper bridge assembly 602. The outer end 658 faces outward, such as to interface with the electrical component 102 (shown in FIG. 1). In an exemplary embodiment, the lower plates 650 include lower bridge plates 660 (FIG. 14) and lower spacer plates 662 (FIG. 13). The lower spacer plates 662 are located between the lower bridge plates 660. The lower spacer plates 662 are shorter than the lower bridge plates 660. The lower bridge plates 660 include overlapping regions 664 configured overlap with adjacent upper plates 630 for thermal transfer between the lower plates 650 and the upper plates 630.

When assembled, the upper bridge plates 640 are aligned with the lower spacer plates 662 and the lower bridge plates 660 are aligned with the upper spacer plates 642. Gaps may be provided between the upper plates 630 and the lower plates 650 to allow compression or movement of the upper plates 630 relative to the lower plates 650. As the thermal bridge 600 is compressed, the amount of overlap between the overlapping regions 644, 664 is increased.

The frame structure used to hold the thermal bridge 600 together is defined by the internal bridge frame 608 and is configured to be contained generally within the interior of the thermal bridge 600. As such, the outer surfaces of the thermal bridge 600 (for example, the top, bottom, front, rear, first side, and second side) are each exposed and accessible for heat dissipation and/or for interfacing with other components, such as the electrical component 102 and/or the heat transfer device 106 (both shown in FIG. 1). The internal bridge frame 608 allows for a large amount of usable external surface area for the thermal bridge 600.

Figure 15:
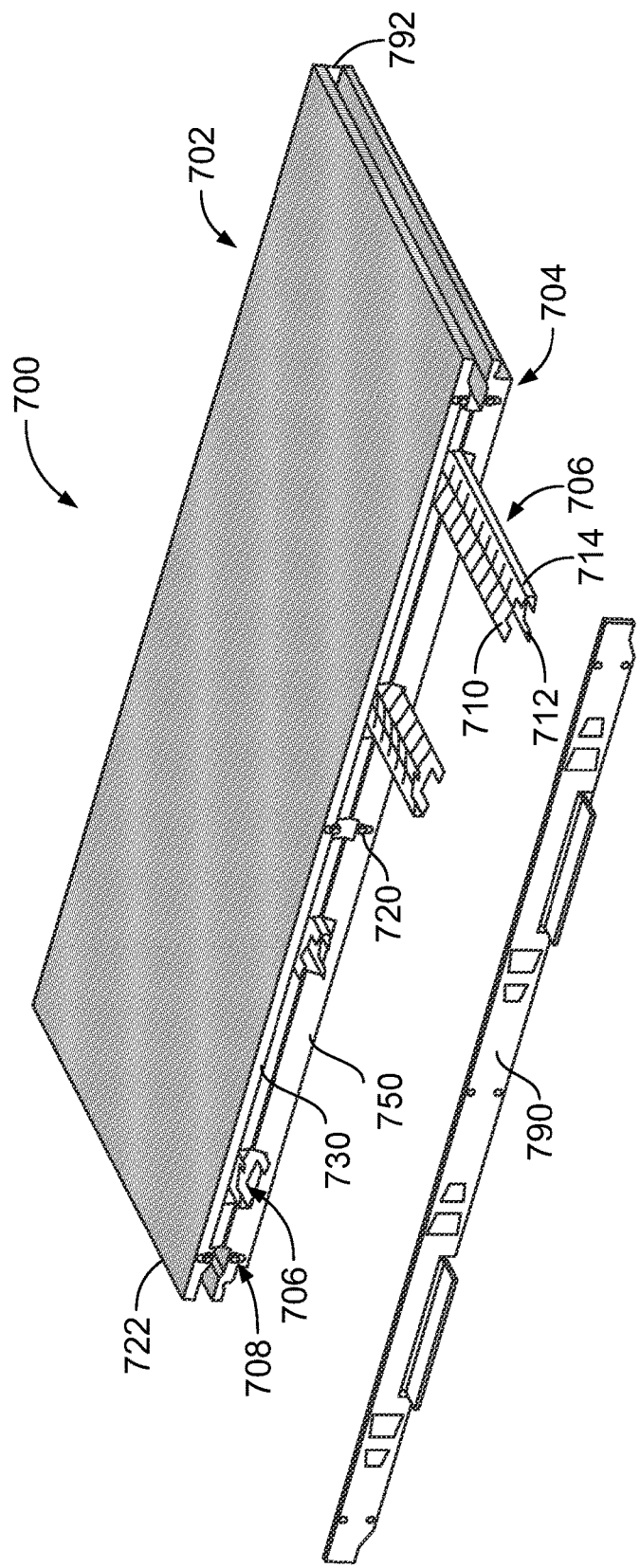
FIG. 15 is an exploded, perspective view of a thermal bridge in accordance with an exemplary embodiment.
Figure 16:
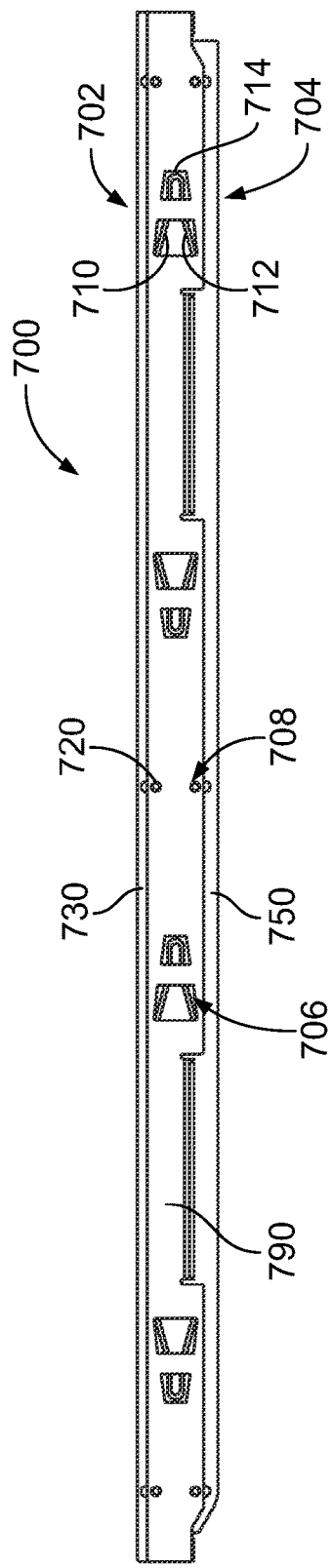
FIG. 16 is a side view of the thermal bridge in accordance with an exemplary embodiment.

FIG. 15 is an exploded, perspective view of a thermal bridge 700 in accordance with an exemplary embodiment. FIG. 16 is a side view of the thermal bridge 700 in accordance with an exemplary embodiment. The thermal bridge 700 is similar to the thermal bridges 200, 500, 600 and includes similar features as the thermal bridges 200, 500, 600.

The thermal bridge 700 includes an upper bridge assembly 702 including a plurality of upper plates 730 and a lower bridge assembly 704 including a plurality of lower plates 750. Spring elements 706 are provided between the upper bridge assembly 702 and the lower bridge assembly 704. The thermal bridge 700 includes an internal bridge frame 708 extending through the interior of the thermal bridge 700 to hold the upper and lower plate stacks together. The thermal bridge 700 includes cap plates 790, 792 at first and second sides of the thermal bridge 700 to hold the upper and lower plate stacks together. The internal bridge frame 708 is coupled to the cap plates 790, 792.

In an exemplary embodiment, the internal bridge frame 708 includes connecting elements 720 passing through slots in the upper plates 730 and the lower plates 750. Optionally, each upper plate 730 may include a plurality of slots receiving corresponding connecting elements 720 and each lower plate 750 may include a plurality of slots receiving corresponding connecting elements 720. In various embodiments, the connecting elements 720 include pins 722. In the illustrated embodiment, three sets of connecting elements 720 are provided, such as at a front, a rear and a middle of the thermal bridge 700.

In an exemplary embodiment, the thermal bridge 700 includes a plurality of the spring elements 706. For example, in the illustrated embodiment, the thermal bridge 700 includes four spring elements 706 positioned approximately equidistant along the length of the thermal bridge 700. The spring elements 706 may be identical to each other.

In the illustrated embodiment, the spring elements 706 are C-shaped leaf springs. Other types of spring elements may be used in alternative embodiments. Each spring element 706 includes an upper spring member 710 and a lower spring member 712. A connecting section 714 extends between the upper and lower spring members 710, 712. The connecting section 714 may be curved, such as being C-shaped. The connecting section 714 is flexible and configured to spread the upper and lower spring members 710, 712 apart when the connecting section is flexed or compressed. The upper spring member 710 is configured to engage the upper plates 730 and is configured to spring bias the upper plates 730 in a first biasing direction (for example, generally upward) generally away from the lower plates 750. The lower spring member 712 is configured to engage the lower plates 750 and is configured to spring bias the lower plates 750 in a second biasing direction (for example, generally downward) generally away from the upper plates 730. The upper plates 730 are configured to float relative to the lower plates 750 and the spring elements 706 allow the floating movement of the upper plates 730 and the lower plates 750. As such, the upper mating interface is conformable to the heat transfer device 106 and the lower mating interface is conformable to the electrical component 102.

In an exemplary embodiment, the upper spring member 710 is segmented to include a plurality of upper spring tabs separated by upper gaps. The upper spring tabs are configured to engage corresponding upper plates 730. The upper spring tabs are movable independent from each other, such as to provide independent spring pressure to the corresponding upper plates 730. Optionally, the upper spring tabs may be flared outward away from the lower spring member 712, such as at an angle.

In an exemplary embodiment, the lower spring member 712 is segmented to include a plurality of lower spring tabs separated by lower gaps. The lower spring tabs are configured to engage corresponding lower plates 750. The lower spring tabs are movable independent from each other, such as to provide independent spring pressure to the corresponding lower plates 750. Optionally, the lower spring tabs may be flared outward away from the upper spring member 710, such as at an angle.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A thermal bridge comprising:
   an upper bridge assembly including a plurality of upper plates arranged in an upper plate stack, each of the upper plates having a front end and a rear end, each of the upper plates having sides between the front end and the rear end of a corresponding one of the upper plates, each of the upper plates having an inner end and an outer end;
   a lower bridge assembly including a plurality of lower plates arranged in a lower plate stack, each of the lower plates having a front end and a rear end, each of the lower plates having sides between the front end and the rear end of a corresponding one of the upper plates, each of the lower plates having an inner end and an outer end, the outer ends of the lower plates configured to face and thermally couple to an electrical component, the sides of the lower plates facing the sides of the upper plates to thermally interface the lower plates with the upper plates;
   a spring element positioned between the upper bridge assembly and the lower bridge assembly, the spring element including an upper spring member engaging each of the upper plates to bias the upper plates in a first biasing direction away from the lower plates, the spring element including a lower spring member engaging each of the lower plates to bias the lower plates in a second biasing direction away from the upper plates; and
   an internal bridge frame having connecting elements extending internally through the upper plates and the lower plates to hold the upper plates in the upper plate stack and to hold the lower plates in the lower plate stack.

2. The thermal bridge of claim 1, wherein the internal bridge frame is only exposed at a first side and a second side of the upper bridge assembly and a first side and a second side of the lower bridge assembly, wherein no portion of the internal bridge frame extends along a front of the upper bridge assembly or a front of the lower bridge assembly, no portion of the internal bridge frame extends along a rear of the upper bridge assembly or a rear of the lower bridge assembly, no portion of the internal bridge frame extends along a top of the upper bridge assembly, and no portion of the internal bridge frame extends along a bottom of the lower bridge assembly.

3. The thermal bridge of claim 1, wherein the connecting elements are remote from a top of the upper bridge assembly.

4. The thermal bridge of claim 1, wherein the upper bridge assembly includes an upper thermal interface configured to be thermally coupled to a heat transfer device, the internal bridge frame being remote from the upper thermal interface such that the internal bridge frame does not obstruct the upper thermal interface.

5. The thermal bridge of claim 1, wherein the connecting elements comprise pins extending entirely through the upper bridge assembly and the lower bridge assembly.

6. The thermal bridge of claim 1, wherein the upper plates include upper slots and the lower plates include lower slots, the connecting elements extending internally through the upper plates in the upper slots and the connecting elements extending internally through the lower plates in the lower slots.

7. The thermal bridge of claim 6, wherein the upper slots are elongated, the upper plates being movable relative to the internal bridge frame with the connecting elements moving relative to the upper plates in the upper slots.

8. The thermal bridge of claim 1, wherein the internal bridge frame includes a first side plate at a first side of the upper bridge assembly and a first side of the lower bridge assembly and the internal bridge frame includes a second side plate at a second side of the upper bridge assembly and a second side of the lower bridge assembly, the connecting elements extending between the first side plate and the second side plate.

9. The thermal bridge of claim 1, wherein the upper plates include upper overlapping regions and the lower plates include lower overlapping regions, the upper bridge assembly and the lower bridge assembly being interested such that the upper overlapping regions overlap with the lower overlapping regions to thermally couple the upper plates and the lower plates.

10. The thermal bridge of claim 1, wherein the upper plates include upper bridge plates and upper spacer plates between the upper bridge plates, the lower plates including lower bridge plates and lower spacer plates between the lower bridge plates, the upper bridge plates being aligned with the lower spacer plates and the lower bridge plates being aligned with the upper spacer plates.

11. The thermal bridge of claim 10, wherein each of the upper bridge plates includes a base, a first leg extending from the base of a corresponding one of the upper bridge plates, and a second leg extending from the base of the corresponding one of the upper bridge plates with an upper pocket between the first leg and the second leg of the corresponding one of the upper bridge plates, each of the upper spacer plates including a spacer base and a spacer tab extending from the spacer base of a corresponding one of the upper spacer plates, and wherein each of the lower bridge plates includes a base, a first leg extending from the base of a corresponding one of the lower bridge plates and a second leg extending from the base of the corresponding one of the lower bridge plates with a lower pocket between the first leg and the second leg of the corresponding one of the lower bridge plates, each of the lower spacer plates including a spacer base and a spacer tab extending from the spacer base of the corresponding one of the lower spacer plates, the spacer tab of each of the lower spacer plates being received in a corresponding one of the upper pocket, the spacer tab of each of the upper spacer plates being received in a corresponding one of the lower pocket, the spring element being positioned in each of the upper pocket and the lower pocket.

12. The thermal bridge of claim 11, wherein the first and second legs of the upper bridge plates overlapping with the first and second legs of the lower bridge plates to thermally couple the upper plates and the lower plates.

13. The thermal bridge of claim 1, wherein each of the upper plates includes an upper thermal interface and each of the lower plates includes a lower thermal interface, the internal bridge frame extending internally through the lower plates such that the front ends, the rear ends and the lower thermal interface of the lower plates are unobstructed at a bottom of the lower bridge assembly, the internal bridge frame extending internally through the upper plates such that the front ends, the rear ends and the upper thermal interface of the upper plates are unobstructed at a top of the upper bridge assembly, the upper plates transferring heat to at least one heat transfer device.

14. The thermal bridge of claim 1, wherein the upper plates engage each other and are movable relative to each other and the lower plates engage each other and are movable relative to each other, the lower plates engage corresponding upper plates and are movable relative to the upper plates.

15. The thermal bridge of claim 1, wherein the upper spring member is segmented including a plurality of upper spring tabs separated by upper gaps, the upper spring tabs being movable independent from each other to provide independent spring pressure on the upper plates, the lower spring member being segmented including a plurality of lower spring tabs separated by lower gaps, the lower spring tabs being movable independent from each other to provide independent spring pressure on the lower plates.

16. A thermal bridge comprising:
   an upper bridge assembly including a plurality of upper plates arranged in an upper plate stack, each of the upper plates having a front end and a rear end, each of the upper plates having sides between the front end and the rear end of a corresponding one of the upper plates, each of the upper plates having an inner end and an outer end, the upper plates including upper bridge plates and upper spacer plates, the upper bridge plates having upper overlapping regions;
   a lower bridge assembly including a plurality of lower plates arranged in a lower plate stack, each of the lower plates having a front end and a rear end, each of the lower plates having sides between the front end and the rear end of a corresponding one of the lower plates, each of the lower plates having an inner end and an outer end, the lower plates including lower bridge plates and lower spacer plates, the lower bridge plates having lower overlapping regions, the lower plates configured to face and thermally couple to an electrical component, the lower spacer plates being aligned with the upper bridge plates and the lower bridge plates being aligned with the upper spacer plates such that the lower overlapping regions overlap with the upper overlapping regions, the sides of the lower bridge plates thermally interfacing with the sides of the upper bridge plates;
   a spring element positioned between the upper bridge assembly and the lower bridge assembly, the spring element including an upper spring member engaging each of the upper plates to bias the upper plates in a first biasing direction away from the lower plates, the spring element including a lower spring member engaging each of the lower plates to bias the lower plates in a second biasing direction away from the upper plates; and
   an internal bridge frame having connecting elements extending internally through the upper plates and the lower plates to hold the upper plates in the upper plate stack and to hold the lower plates in the lower plate stack.

17. The thermal bridge of claim 16, wherein the internal bridge frame is only exposed at a first side and a second side of the upper bridge assembly and a first side and a second side of the lower bridge assembly, wherein no portion of the internal bridge frame extends along a front of the upper bridge assembly or a front of the lower bridge assembly, no portion of the internal bridge frame extends along a rear of the upper bridge assembly or a rear of the lower bridge assembly, no portion of the internal bridge frame extends along a top of the upper bridge assembly, and no portion of the internal bridge frame extends along a bottom of the lower bridge assembly.

18. The thermal bridge of claim 16, wherein the upper bridge assembly includes an upper thermal interface configured to be thermally coupled to a heat transfer device, the internal bridge frame being remote from the upper thermal interface such that the internal bridge frame does not obstruct the upper thermal interface.

19. The thermal bridge of claim 16, wherein each of the upper plates includes an upper thermal interface and each of the lower plates includes a lower thermal interface, the internal bridge frame extending internally through the lower plates such that the front ends, the rear ends and the lower thermal interface of the lower plates are unobstructed at a bottom of the lower bridge assembly, the internal bridge frame extending internally through the upper plates such that the front ends, the rear ends and the upper thermal interface of the upper plates are unobstructed at a top of the upper bridge assembly, the upper plates transferring heat to at least one heat transfer device.

20. The thermal bridge of claim 16, wherein the upper spring member is segmented including a plurality of upper spring tabs separated by upper gaps, the upper spring tabs being movable independent from each other to provide independent spring pressure on the upper plates, the lower spring member being segmented including a plurality of lower spring tabs separated by lower gaps, the lower spring tabs being movable independent from each other to provide independent spring pressure on the lower plates.

21. A thermal bridge comprising:
   an upper bridge assembly including a plurality of upper plates arranged in an upper plate stack, each of the upper plates having a front end and a rear end, each of the upper plates having sides between the front end and the rear end of a corresponding one of the upper plates, each of the upper plates having an inner end and an outer end, each of the upper plates having an upper thermal interface, the upper plates being independently movable relative to each other such that the upper thermal interface is conformable to a heat transfer device;
   a lower bridge assembly including a plurality of lower plates arranged in a lower plate stack, each of the lower plates having a front end and a rear end, each of the lower plates having sides between the front end and the rear end of a corresponding one of the lower plates, each of the lower plates having an inner end and an outer end, the sides of the lower plates facing the sides of the upper plates to thermally interface the lower plates with the upper plates, each of the lower plates having a lower thermal interface, the lower plates being independently movable relative to each other such that the lower thermal interface is conformable to an electrical component;

a first cap plate coupled to a first side of the upper plate stack and the lower plate stack;

a second cap plate coupled to a second side of the upper plate stack and the lower plate stack;

a spring element positioned between the upper bridge assembly and the lower bridge assembly, the spring element including an upper spring member engaging each of the upper plates to bias the upper plates in a first biasing direction away from the lower plates, the spring element including a lower spring member engaging each of the lower plates to bias the lower plates in a second biasing direction away from the upper plates; and an internal bridge frame having connecting elements extending between the first cap plate and the second cap plate, the connecting elements holding the upper plates in the upper plate stack and the lower plates in the lower plate stack;

wherein the internal bridge frame extends internally through the lower plates such that the front ends, the rear ends and the lower thermal interface are unobstructed at the bottom of the lower bridge assembly, the lower plates transferring heat from the electrical component to the upper plates, and wherein the internal bridge frame extends internally through the upper plates such that the front ends, the rear ends and the upper thermal interface are unobstructed at the top of the upper bridge assembly, the upper plates transferring the heat from the lower plates to the heat transfer device.

22. The thermal bridge of claim 21, wherein the internal bridge frame is only exposed at a first side and a second side of the upper bridge assembly and a first side and a second side of the lower bridge assembly, wherein no portion of the internal bridge frame extends along a front of the upper bridge assembly, no portion of the internal bridge frame extends along a front of the lower bridge assembly, no portion of the internal bridge frame extends along a rear of the upper bridge assembly, no portion of the internal bridge frame extends along a rear of the lower bridge assembly, no portion of the internal bridge frame extends along the top of the upper bridge assembly, and no portion of the internal bridge frame extends along the bottom of the lower bridge assembly.

23. The thermal bridge of claim 21, wherein the upper spring member is segmented including a plurality of upper spring tabs separated by upper gaps, the upper spring tabs being movable independent from each other to provide independent spring pressure on the upper plates, the lower spring member being segmented including a plurality of lower spring tabs separated by lower gaps, the lower spring tabs being movable independent from each other to provide independent spring pressure on the lower plates.

* * * * *